(12) United States Patent
Yamasaki et al.

(10) Patent No.: US 7,960,278 B2
(45) Date of Patent: Jun. 14, 2011

(54) METHOD OF FILM DEPOSITION

(75) Inventors: Hideaki Yamasaki, Nirasaki (JP); Yumiko Kawano, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 405 days.

(21) Appl. No.: 12/083,962

(22) PCT Filed: Oct. 24, 2006

(86) PCT No.: PCT/JP2006/321156
§ 371 (c)(1),
(2), (4) Date: Apr. 23, 2008

(87) PCT Pub. No.: WO2007/049612
PCT Pub. Date: May 3, 2007

(65) Prior Publication Data
US 2009/0140353 A1    Jun. 4, 2009

(30) Foreign Application Priority Data
Oct. 24, 2005 (JP) .................. 2005-308817

(51) Int. Cl.
H01L 21/4763 (2006.01)
(52) U.S. Cl. ........ 438/643; 438/648; 438/653; 118/708; 118/725
(58) Field of Classification Search .................. 438/643, 438/648, 653, 664; 118/708, 725
See application file for complete search history.

(56) References Cited

U.S. PATENT DOCUMENTS

| 6,080,446 A | 6/2000 | Tobe et al. |
| 6,153,519 A | 11/2000 | Jain et al. |
| 6,919,273 B1 * | 7/2005 | Otsuki et al. ............... 438/683 |
| 7,001,675 B2 * | 2/2006 | Chan ....................... 428/685 |
| 7,041,335 B2 * | 5/2006 | Chung ..................... 427/255.394 |
| 7,211,508 B2 * | 5/2007 | Chung et al. ............... 438/633 |
| 2003/0113986 A1 * | 6/2003 | Sakamoto et al. .......... 438/584 |
| 2005/0009358 A1 | 1/2005 | Choi et al. |
| 2005/0104142 A1 | 5/2005 | Narayanan et al. |

FOREIGN PATENT DOCUMENTS

| JP | 10-284440 | 10/1998 |
| JP | 11-131233 | 5/1999 |
| JP | 2001-049434 | 2/2001 |
| JP | 2001-077355 | 3/2001 |
| JP | 2002-050588 | 2/2002 |
| JP | 2004-263265 | 9/2004 |

(Continued)

OTHER PUBLICATIONS

Korean Office Action issued on Dec. 31, 2009 for Korean Application No. 2008-7001229 w/ English language translation.

(Continued)

Primary Examiner — Phuc T Dang
(74) Attorney, Agent, or Firm — Smith, Gambrell & Russell, LLP

(57) ABSTRACT

The present invention is a method of film deposition that comprises a film-depositing step of supplying a high-melting-point organometallic material gas and a nitrogen-containing gas to a processing vessel that can be evacuated, so as to deposit a thin film of a metallic compound of a high-melting-point metal on a surface of an object to be processed placed in the processing vessel. A partial pressure of the nitrogen-containing gas during the film-depositing step is 17% or lower, in order to increase carbon density contained in the thin film.

7 Claims, 9 Drawing Sheets

FOREIGN PATENT DOCUMENTS

| | | |
|---|---|---|
| JP | 2004-277772 | 10/2004 |
| JP | 2005-11940 | 1/2005 |
| JP | 2005-512337 | 4/2005 |
| KR | 1998-080896 | 11/1998 |
| KR | 2001-0109219 | 12/2001 |

OTHER PUBLICATIONS

Joo et al.,"Behavior of Effective Work Function in Metal/High K Gate Stack under High Temperature Process", Extended Abstracts of the 2004 International Conference on Solid State Devices and Materials, Tokyo, 2004, pp. 202-203.

Schaeffer et al., "Challenges for the Integration of Metal Gate Electrodes", IEDM Tech.Dig., .pp. 287-290, Dec. 2004 IEEE.

Ichihara et al., "Ta-based metal gate(Ta,TaBx,TaNx and TaCx)-Modulated Work Function and Improved Thermal Stability", Extended Abstracts of the 2005 International Conference on Solid State Devices ad Materials Kobe, 2005, pp. 850-851.

P.J. Chen et al., "Surface spectroscopic studies of the deposition . . . precursors", Mat.Res.Soc.Symp.Proc., 1994, vol. 337, pp. 555-560.

PCT Notification of Transmittal of Translation of the International Preliminary Examination Report (Form PCT/IB/338) dated Jan. 2004.

PCT International Preliminary Report on Patentability (Form PCT/IB/373) dated Jan. 2004.

PCT Written Opinion Of The International Searching Authority (Form/ISA/237) dated Apr. 2005.

Korean Office Action issued on Jun. 30, 2010 for Korean Application No. 10-2008-7001229.

Rehmet et al., In Situ XPS Studies of the Deposition of $TiN_xC_y$ Films from Tetrakis (dimethylamido) titanium(IV) Bis[N,N'-bis(tert-butyl)ethylenediamido}titanium(IV), Chem. Matter, vol. 8, pp. 2712-2720 (1996).

Korean Office Action issued on Dec. 23, 2010 for Application No. 10-2008-7001229 w/ English language translation.

* cited by examiner

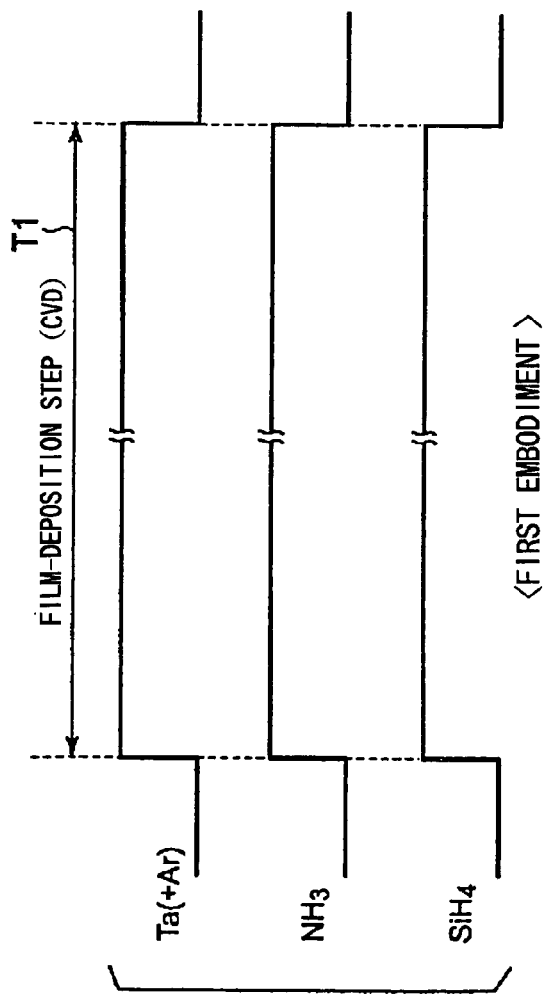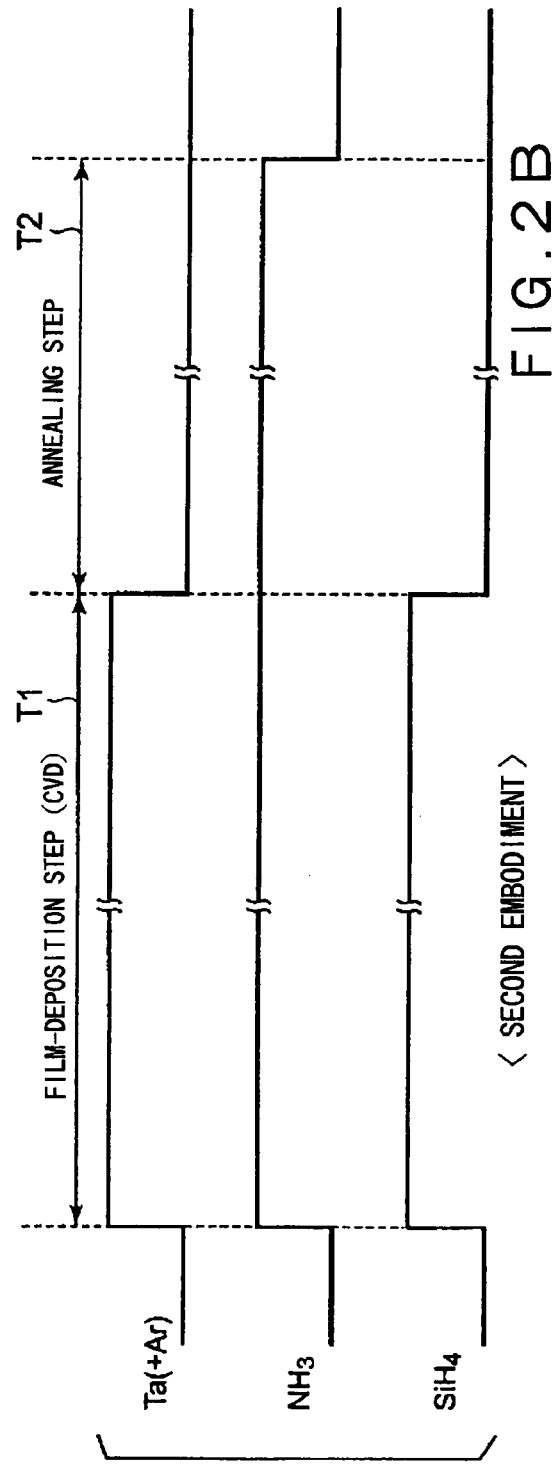

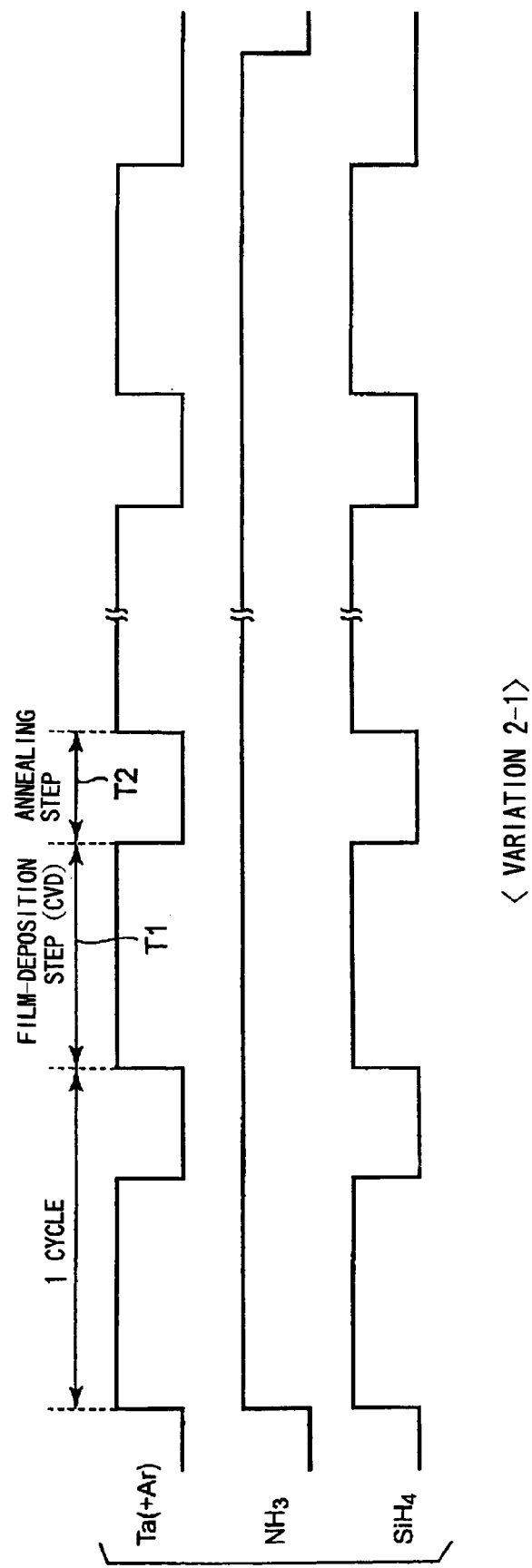

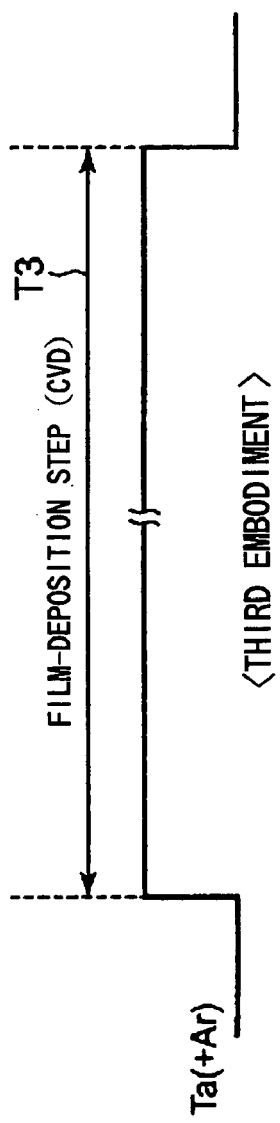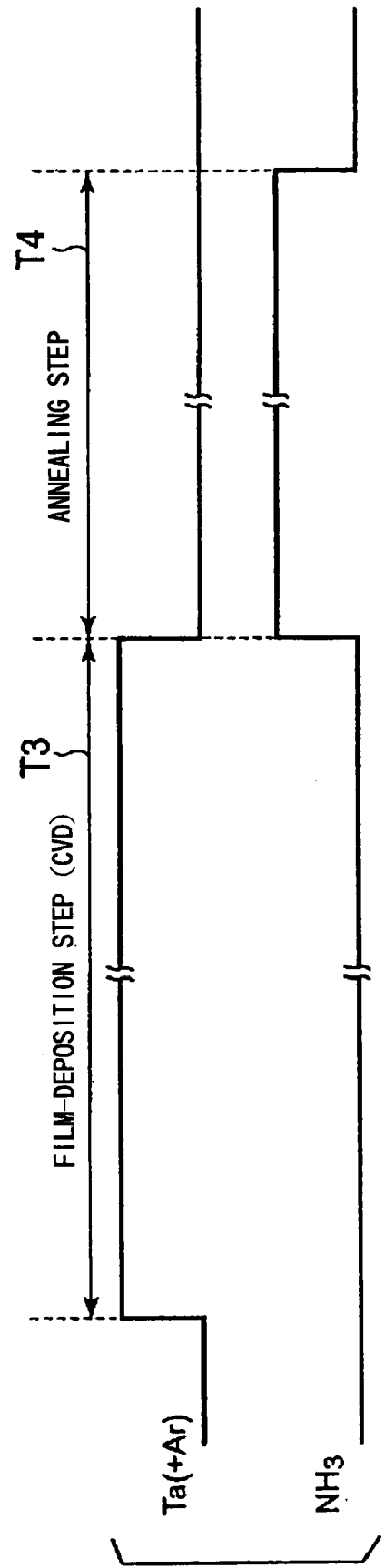
FIG.4A  <THIRD EMBODIMENT>
FIG.4B  <VARIATION 3-1>

⟨FOURTH EMBODIMENT⟩

⟨FIFTH EMBODIMENT⟩

FIG. 9A

| | CONDITIONS FOR DEPOSITION OF TaSiN FILM CONTAINING C (Ta SOURCE GAS: 3~10sccm) | | | | | | ANALYSIS RESULT OF TaSiN FILM CONTAINING C | | | | | |
|---|---|---|---|---|---|---|---|---|---|---|---|---|
| | Temp | Press | Ar | Ar (CARRIER) | SiH4 | NH3 | DR | XPS(atomic%) | | | | |
| | (degC) | (Torr) | (sccm) | (sccm) | (sccm) | (sccm) | (nm/min) | O | N | C | Si | Ta |
| | 600 | 0.3 | 280 | 100 | 400 | 20 | 5 | 12.0 | 26.2 | 12.2 | 19.3 | 30.3 |
| | 600 | 0.3 | 280 | 100 | 400 | 20 | 5 | 7.7 | 34.0 | 9.5 | 19.2 | 29.6 |
| | 400 | 0.3 | 520 | 100 | 0 | 0 | 1 | 30.5 | 17.4 | 14.8 | 0.0 | 37.4 |
| | 600 | 0.3 | 40 | 40 | 500 | 200 | 8.4 | 5.8 | 38.9 | 4.6 | 18.2 | 32.5 |
| | 400 | 0.3 | 480 | 100 | 0 | 200 | 10.5 | 1.6 | 38.9 | 2.8 | 0.0 | 57.7 |
| | 400 | 0.3 | 80 | 100 | 400 | 200 | | 7.3 | 36.9 | 3.5 | 11.3 | 41.0 |

FIG. 9B

| | CONDITIONS FOR DEPOSITION OF TaSiN FILM CONTAINING C (Ta SOURCE GAS: 3~10sccm) | | | | | | ANALYSIS RESULT OF TaSiN FILM CONTAINING C | | | | | |
|---|---|---|---|---|---|---|---|---|---|---|---|---|
| | Temp | Press | Ar | Ar (CARRIER) | SiH4 | NH3 | DR | XPS(atomic%) | | | | |
| | (degC) | (Torr) | (sccm) | (sccm) | (sccm) | (sccm) | (nm/min) | O | N | C | Si | Ta |
| | 400 | 0.3 | 250 | 100 | 200 | 200 | 4.5 | 6.1 | 32.0 | 9.2 | 7.3 | 45.3 |
| | 400 | 0.3 | 250 | 100 | 0 | 200 | 6.5 | 9.1 | 27.5 | 11.7 | 0.0 | 51.7 |

[DIFFICULT TO MEASURE TRUE VALUE OF FLOW RATE OF Ta SOURCE GAS BECAUSE OF BUBBLING]

METHOD OF FILM DEPOSITION

CROSS-REFERENCES TO RELATED APPLICATIONS

This is a 371 of PCT/JP2006/321156 filed Oct. 24, 2006.

BACKGROUND OF THE INVENTION

1. Field of the Invention

The present invention relates to a method of film deposition for forming a thin film on an object to be processed, such as a semiconductor wafer, and to a film deposition system.

2. Background Art

Generally, in the production of semiconductor integrated circuits, objects to be processed, such as semiconductor wafers, are repeatedly subjected, sheet by sheet, to various processing steps, such as film deposition, etching, heat treatment, modification, and recrystallization, thereby obtaining desired integrated circuits. Moreover, the recent demand for thinner integrated circuits having higher levels of integration has made the line width, film thickness, etc. of integrated circuits much smaller than ever.

Metallic compound films of high-melting-point organometallic materials tend to be often used as materials that show relatively low resistivity even when they are made thinner than ever and patterned to have extremely small line widths, that are excellent in adhesion with dissimilar materials, and that can be deposited at relatively low temperatures. Examples of metallic compound films of high-melting-point organometallic materials include TaN (tantalum nitride film). There is also such a case where silicon, carbon, or both of these elements are incorporated into tantalum nitride film, as needed, to give TaSiN, TaCN, or TaSiCN film, respectively.

For example, tantalum nitride film is often used, in a transistor, as a gate electrode, as a barrier layer to be interposed between a metal gate electrode and a polysilicon layer formed on it, as a barrier layer to be used for making contact via through holes, via holes, etc., or as a barrier layer for aluminum or copper wiring, and, in a capacitor, as an upper or lower electrode.

A metallic compound film of a high-melting-point organometallic material, such as tantalum nitride film, is usually formed by the CVD (Chemical Vapor Deposition) method, or by the ALD (Atomic Layer Deposition) method in which extremely thin films are successively layered, one over the other, by alternately and repeatedly feeding a high-melting-point organometallic material gas and a nitride gas (Published Japanese Translation No. 2005-512337, and Japanese Laid-Open Patent Publications No. 2002-50588, No. 2004-277772, No. 2004-263265 and No. 2005-11940).

Recently, design rules have become very strict. Specifically, line width and film thickness have become smaller. Thus, it has been requested to shift from a conventional polysilicon gate to a metallic gate, for example for a gate electrode of a transistor. Correspondingly, as a material of a PMOS gate electrode, PT, Ru, W or the like have been found out.

However, as a material of an nMOS gate electrode, it is still difficult to find out some materials having such a low work function as 4.1 eV. For example, in the documents 1 (Behavior of Effective Work Function in Metal/High K Gate Stack under High Temperature Process ] Extended Abstracts of the 2004 International Conference on Solid State Devices and Material, Tokyo 2004 pp. 202-203), work function of 4.4 to 4.7 eV is disclosed for a gate electrode made of TaN, and work function of 4.3 to 4.5 eV is disclosed for a gate electrode made of TaSiN. On the other hand, in the documents 2 (Challenges for The Integration of Metal Gate Electrodes ] IEDM Tech-.Dig.P.P.287-290 December 2004 IEEE), it is reported that TaxCy achieves work function of 4.18 eV, which is lower than that of TaSiN. However, in the documents 3 (Ta-based metal gate (Ta, TaBx, TaNx and Ta(x)-Modulated Work Function and Improved Thermal Stability ] Extended Abstract of the 2005 International Conference on Solid State Devices and Materials Kobe 2005 pp. 850-851), 4.8 to 5.0 eV is shown as work function of TaCx. Taking into consideration all these documents, it can be said that a material showing stably low work function has not been found out yet.

SUMMARY OF THE INVENTION

In view of the aforementioned problems in the prior art and in order to solve them effectively, we accomplished the present invention. Accordingly, an object of the present invention is to provide a method of film deposition and a film decomposition system that can deposit a thin film of a metallic compound of a high-melting-point metal, whose carbon density is sufficiently enhanced so that the thin film can achieve low work function, resulting in lowering of a threshold value of a gate electrode.

The inventors have earnestly studied a method of film deposition for depositing a thin film of a metallic compound of a high-melting-point metal. As a result, the inventors have found out that, in the case of CVD (Chemical Vapor Deposition), when a partial pressure of an ammonium gas is set lower than a predetermined value, carbon density in the film is sufficiently raised, so that work function and the threshold value of a gate electrode can be reduced.

In addition, the inventors have found out that, when a material gas and an ammonium gas or the like are alternatively and repeatedly supplied into the processing vessel, carbon density in the film can be sufficiently raised.

The present invention is based on the above findings.

The present invention is a method of film deposition that comprises: a film-depositing step of supplying a high-melting-point organometallic material gas and a nitrogen-containing gas to a processing vessel that can be evacuated, so as to deposit a thin film of a metallic compound of a high-melting-point metal on a surface of an object to be processed placed in the processing vessel; wherein a partial pressure of the nitrogen-containing gas during the film-depositing step is 17% or lower, in order to increase carbon density contained in the thin film.

According to the above feature, i.e., when the film-depositing step is conducted under a condition wherein a partial pressure of the nitrogen-containing gas is 17% or lower relative to the total pressure, the carbon density of the thin film can be raised. Thus, for example, a threshold voltage of a gate electrode of a transistor deice can be lowered sufficiently.

In the case, an annealing step of annealing the thin film in an atmosphere of a nitrogen-including gas or a silicon-containing gas may be conducted, after the film-deposition step. According to this feature, by the annealing step, unreacted components in the thin film, which may have an effect on resistivity or the like, can be reduced (for example, oxygen density can be reduced), and/or densification can be achieved.

In the case, for example, the annealing step may be conducted until a silicon film is formed on the thin film, in the atmosphere of the silicon-containing gas. Alternatively, for example, the film-depositing step and the annealing step may be repeated in this order more than once.

Alternatively, the present invention is a method of film deposition that comprises: a film-depositing step of supplying a high-melting-point organometallic material gas to a processing vessel that can be evacuated, so as to deposit a thin film of a metallic compound of a high-melting-point metal on a surface of an object to be processed placed in the processing vessel; wherein only the high-melting-point organometallic material gas is supplied during the film-depositing step without supplying any nitrogen-containing gas, in order to increase carbon density contained in the thin film.

According to the above feature as well, i.e., when the above film-depositing step is conducted, the carbon density of the thin film can be raised. Thus, for example, a threshold voltage of a gate electrode of a transistor deice can be lowered sufficiently.

In the case, an annealing step of annealing the thin film in an atmosphere of a nitrogen-including gas or a silicon-containing gas may be conducted, after the film-deposition step. According to this feature, by the annealing step, unreacted components in the thin film, which may have an effect on resistivity or the like, can be reduced (for example, oxygen density can be reduced), and/or densification can be achieved.

In the case, for example, the annealing step may be conducted until a silicon film is formed on the thin film, in the atmosphere of the silicon-containing gas.

Alternatively, the present invention is a method of film deposition that comprises: a first gas-supplying step of supplying a high-melting-point organometallic material gas to a processing vessel that can be evacuated; and a second gas-supplying step of supplying a nitrogen-containing gas and/or a silicon-containing gas to the processing vessel; wherein a thin film of a metallic compound of a high-melting-point metal is deposited on a surface of an object to be processed placed in the processing vessel; characterized in that the first and second gas-supplying steps are alternately carried out more than once, in order to increase carbon density contained in the thin film.

According to the above feature as well, i.e., when the first and second gas-supplying steps are alternately carried out more than once, the carbon density of the thin film can be raised. Thus, for example, a threshold voltage of a gate electrode of a transistor deice can be lowered sufficiently.

Preferably, a purging step of purging the gas remaining in the processing vessel is carried out between the first and second gas-supplying steps.

For example, the silicon-containing gas is selected from the group consisting of monosilane [$SiH_4$], disilane [$Si_2H_6$], methylsilane [$CH_3SiH_3$], dimethylsilane [$(CH_3)_2SiH_2$], hexamethyidisilazane (HMDS), disilylamine (DSA), trisilylamine (TSA), bistertiarybutylaminosilane (BTBAS), trimethylsilane, tetramethylsilane, bisdimethylaminosilane, tetradimethyl-aminosilane, triethylsilane, and tetraethylsilane.

For example, the nitrogen-containing gas is a compound selected from the group consisting of ammonia [$NH_3$], hydrazine [$NH_2NH_2$], methylhydrazine [$(CH_3)(H)NNH_2$], dimethylhydrazine [$(CH_3)_2NNH_2$], t-butylhydrazine [$(CH_3)_3C(H)NNH_2$], phenylhydrazine [$C_6H_5N_2H_3$], 2,2'-azo-isobutane [$(CH_3)_6C_2N_2$], ethylazide [$C_2H_5N_3$], pyridine [$C_5H_5N$], and pyrimidine [$C_4H_4N_2$].

For example, the high-melting-point organometallic material is a high-melting-point organometallic material containing tantalum and is a compound selected from the group consisting of t-butyliminotris(diethylamino)tantalum (TBT-DET): [$(NEt_2)_3TaN-Bu^t$], pentakis(ethylmethylamino)tantalum (PEMAT): [$Ta(NMeEt)_5$], pentakis-(dimethylamino)tantalum (PDMAT): [$Ta(NMe_2)_5$], pentakis(diethylamino)-tantalum (PDEAT): [$Ta(NEt_2)_5$], t-butyliminotris(ethylmethylamino)tantalum (TBTMET): [$(NEtMe)_3TaN-Bu^t$], t-amylimidotris(dimethylamino)tantalum (TBT-DMT): [$(NMe_2)_3TaN-Bu^t$], and t-amylimidotris (dimethylamino)tantalum (Taimata): [$(NMe_2)_3TaNC(CH_3)_2C_2H_5$] or [$Ta(Nt-Am)(NMe_2)_3$].

For example, the high-melting-point organometallic material is a high-melting-point organometallic material containing tantalum and is a compound selected from the group consisting of t-butyliminotris(diethylamino)tantalum (TBT-DET): [$(NEt_2)_3TaN-Bu^t$], pentakis(ethylmethylamino)tantalum (PEMAT): [$Ta(NMeEt)_5$], pentakis-(dimethylamino)tantalum (PDMAT): [$Ta(NMe_2)_5$], pentakis(diethylamino)-tantalum (PDEAT): [$Ta(NEt_2)_6$], t-butyliminotris(ethylmethylamino)tantalum (TBTMET): [$(N Et_2M e)_3Ta N-But$], t-amylimidotris(dimethylamino)tantalum (TBT-DMT): [$(NMe_2)_3TaN-Bu^t$], and t-amylimidotris(dimethylamino)tantalum (Taimata): [$(NMe_2)_3TaNC(CH_3)_2C_2H_5$] ($Ta(Nt-Am)(NMe_2)_3$).

Alternatively, the high-melting-point organometallic material is a high-melting-point organometallic material containing titanium, for example, and is a compound selected from the group consisting of tetrakisdiethylaminotitanium $Ti[N(C_2H_5)_2]_4$, tetrakisdimethylaminotitanium $Ti[N(CH_3)_2]_4$, and tetrakisethylmethylaminotitanium $Ti[N(CH_3)(C_2H_5)]_4$.

Alternatively, the high-melting-point organometallic material is a high-melting-point organometallic material containing tungsten, for example, and is a compound selected from the group consisting of hexacarbonyltungsten $W(CO)_6$, and bistertiarybutylimidobisdimethyl-amidotungsten $(t-Bu^tN)_2(Me_2N)_2W$.

Alternatively, the high-melting-point organometallic material is a high-melting-point organometallic material containing hafnium, for example, and is a compound selected from the group consisting of tetrakisdimethylaminohafnium $Hf[N(CH_3)_2]_4$, and dimethylbis(cyclopenta-dienyl)hafnium $Hf(CH_3)_2 (C_5H_5)_2$.

Further, the present invention is a film deposition system comprising: a processing vessel that can be evacuated; a supporting unit for supporting, in the processing vessel, an object to be processed; a heating unit for heating the object to be processed supported by the supporting unit; a high-melting-point-organometallic-material-gas-supplying unit for supplying a high-melting-point organometallic material gas; a reactant-gas-supplying system for supplying a gas, or two or more gases, selected from a nitrogen-containing gas and a silicon-containing gas; a gas-feeding unit connected to the high-melting-point-organometallic-material-gas-supplying unit and the reactant-gas-supplying system, for feeding to the processing vessel the gas, or the two or more gases, selected from a nitrogen-containing gas and a silicon-containing gas, and the high-melting-point organometallic material gas; and a controller for controlling the gas-feeding unit in such a manner that a partial pressure of the nitrogen-containing gas is 17% or lower, in order to deposit a thin film of a metallic compound on the object to be processed and also in order to increase carbon density contained in the thin film.

Alternatively, the present invention is a film deposition system comprising: a processing vessel that can be evacuated; a supporting unit for supporting, in the processing vessel, an object to be processed; a heating unit for heating the object to be processed supported by the supporting unit; a high-melting-point-organometallic-material-gas-supplying unit for supplying a high-melting-point organometallic material gas; a reactant-gas-supplying system for supplying a gas, or two or more gases, selected from a nitrogen-containing gas and a silicon-containing gas; a gas-feeding unit connected to the high-melting-point-organometallic-material-gas-supplying unit and the reactant-gas-supplying system, for feeding to the processing vessel the gas, or the two or more gases, selected from a nitrogen-containing gas and a silicon-containing gas, and the high-melting-point organometallic material gas; and a controller for controlling the gas-feeding unit in such a manner that a step of supplying the high-melting-point organometallic material gas and a step of supplying the gas or the two or more gases selected from a nitrogen-containing gas and a silicon-containing gas are alternately carried out more than once, in order to deposit a thin film of a metallic compound on the object to be processed and also in order to increase carbon density contained in the thin film.

Alternatively, the present invention is a transistor formed on an object to be processed, wherein a gate electrode of the transistor includes a thin film of a metallic compound of a high-melting-point metal, in which carbon density of 6 atomic % or more is contained.

In the case, for example, a polysilicon film is formed as an upper layer of the thin film.

In addition, for example, a high dielectric material is used as a gate insulation film of the transistor. In the case, for example, the high dielectric material is hafnia or zirconia, or silicate thereof, or silicate nitride thereof.

Furthermore, the present invention is a storage medium that stores a computer program with which a computer performs a method of controlling a film deposition system including: a processing vessel that can be evacuated; a supporting unit for supporting, in the processing vessel, an object to be processed; a heating unit for heating the object to be processed, supported by the supporting unit; a high-melting-point-organometallic-material-gas-supplying unit for supplying a high-melting-point organometallic material gas; a reactant-gas-supplying system for supplying a gas, or two or more gases, selected from a nitrogen-containing gas and a silicon-containing gas; and a gas-feeding unit connected to the high-melting-point-organometallic-material-gas-supplying unit and the reactant-gas-supplying system, for feeding to the processing vessel the gas, or the two or more gases, selected from a nitrogen-containing gas and a silicon-containing gas, and the high-melting-point organometallic material gas; the method being for controlling the gas-feeding unit, in such a manner that a partial pressure of the nitrogen-containing gas is 17% or lower, in order to deposit a thin film of a metallic compound on the object to be processed and also in order to increase carbon density contained in the thin film.

Alternatively, the present invention is a storage medium that stores a computer program with which a computer performs a method of controlling a film deposition system including: a processing vessel that can be evacuated; a supporting unit for supporting, in the processing vessel, an object to be processed; a heating unit for heating the object to be processed, supported by the supporting unit; a high-melting-point-organometallic-material-gas-supplying unit for supplying a high-melting-point organometallic material gas; a reactant-gas-supplying system for supplying a gas, or two or more gases, selected from a nitrogen-containing gas and a silicon-containing gas; and a gas-feeding unit connected to the high-melting-point-organometallic-material-gas-supplying unit and the reactant-gas-supplying system, for feeding to the processing vessel the gas, or the two or more gases, selected from a nitrogen-containing gas and a silicon-containing gas, and the high-melting-point organometallic material gas; the method being for controlling the gas-feeding unit, in such a manner that a step of supplying the high-melting-point organometallic material gas and a step of supplying the gas or the two or more gases selected from a nitrogen-containing gas and a silicon-containing gas are alternately carried out more than once, in order to deposit a thin film of a metallic compound on the object to be processed and also in order to increase carbon density contained in the thin film.

BRIEF DESCRIPTION OF THE DRAWINGS

FIG. 2A is a diagram showing a gas supply mode in a first embodiment of the method of the present invention.

FIG. 2B is a diagram showing a gas supply mode in a second embodiment of the method of the present invention.

FIG. 3 is a diagram showing a gas supply mode in a variation (2-1) of the second embodiment of the method of the present invention.

FIG. 4A is a diagram showing a gas supply mode in a third embodiment of the method of the present invention.

FIG. 4B is a diagram showing a gas supply mode in a variation (3-1) of the third embodiment of the method of the present invention.

FIGS. 9A and 9B are tables showing the major film-deposition conditions and the analysis result of the formed thin films.

BEST MODE FOR CARRYING OUT THE INVENTION

Embodiments of the film deposition system and the method of film deposition according to the invention will be described hereinafter with reference to the accompanying drawings.

Figure 1:
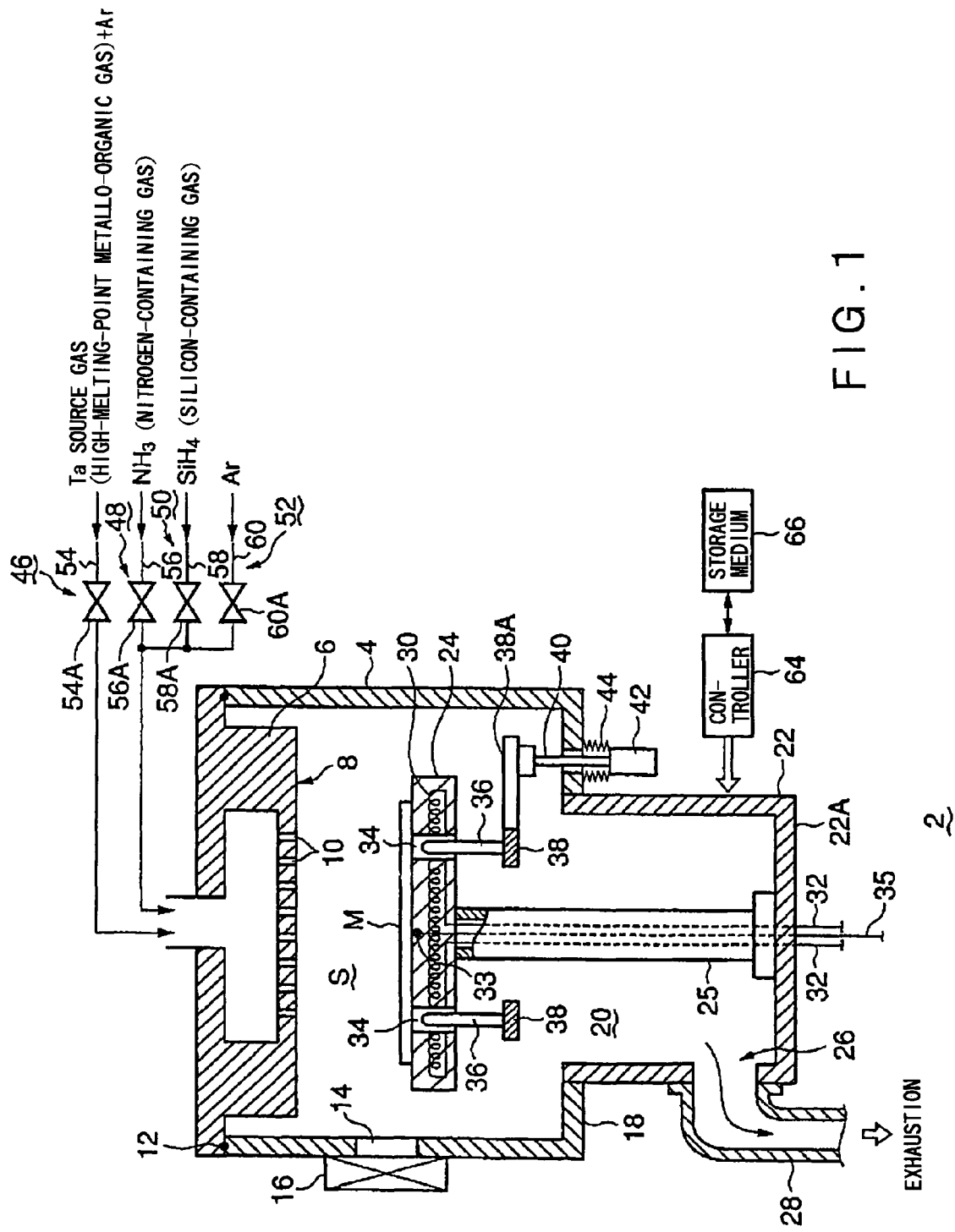
FIG. 1 is a sectional, structural view showing an embodiment of the film deposition system according to the present invention.

FIG. 1 is a sectional, structural view showing an embodiment of the film deposition system according to the present invention. For example, $Ta[NC(CH_3)_2C_2H_5][N(CH_3)_2]_3$:Ta $(Nt-Am)(NMe_2)_3$ (hereinafter also referred to as "a Ta source") is herein used as the high-melting-point organometallic material. Further, among a nitrogen-containing gas and a silicon-containing gas, only the nitrogen-containing gas or both of the nitrogen-containing gas and the silicon-containing gas are used as reactant gases in order to deposit a metallic compound film. Specifically, $NH_3$ gas and monosilane ($SiH_4$) are used as a nitrogen-containing gas and a silicon-containing gas, respectively, and silicon-containing tantalum nitride film (TaSiN) is deposited as a metallic compound film.

As shown in the figure, a heat processing system 2 has an aluminum-made processing vessel 4 whose inside is nearly cylindrical. A shower head 6 that is a gas-feeding unit for feeding necessary process gases, such as the Ta source, $NH_3$ gas, monosilane gas, and Ar gas, is attached to the ceiling of the processing vessel 4. A gas-injecting face 8, i.e., the under-side face of the shower head 6, has a large number of gas-injecting holes 10. From the gas-injecting holes 10, the process gases are jetted towards a processing space S. Alternatively, the shower head 6 may have a so-called post-mix structure that allows the Ta source to be fed separately from $NH_3$ and monosilane gas.

At the joint of this shower head 6 and an upper end opening of the processing vessel 4 is placed a sealing member 12 composed of an O ring, for example. Owing to such a sealing member 12, the processing vessel 4 can be kept airtight.

The processing vessel 4 has, in its sidewall, a gate 14 through which a semiconductor wafer W as an object to be processed is carried in or out of the processing vessel 4. The gate 14 is provided with an on-off gate valve 16 capable of closing the gate 14 to keep the processing vessel 4 airtight.

The processing vessel 4 has an exhaust-gas-concave space 20 at its bottom 18. Specifically, there is a large opening in the center of the bottom 18 of the processing vessel 4, and from this opening, a cylindrical defining wall 22 with a closed bottom end extends downwardly. The internal space surrounded by the cylindrical defining wall 22 is the exhaust-gas-concave space 20. At the bottom 22A of the cylindrical wall 22 defining the exhaust-gas-concave space 20, there stands upright a support 25 in the shape of, for example, a circular cylinder. To the upper end of the support 25 is fixed a table 24 serving as a supporting unit. The wafer M is placed on and held (supported) by this table 24.

The diameter of the opening of the above-described exhaust-gas-concave space 20 is smaller than that of the table 24. Therefore, a process gas that flows downwardly along the periphery of the table 24 comes under the table 24 and then flows into the space 20. The cylindrical defining wall 22 has, in its lower part, an exhaust port 26 communicating with the exhaust-gas-concave space 20. The exhaust port 26 communicates also with an evacuation system 28 composed of a vacuum pump, a pressure-regulating valve, etc., which are not shown in the figure. The processing vessel 4 and the exhaust-gas-concave space 20 can thus be evacuated. By automatically adjusting the degree of the openness of the pressure-regulating valve, the internal pressure of the processing vessel 4 can be kept constant or quickly changed to the desired pressure.

Inside the table 24, there is, as a heating unit, an electrical resistance heater 30 in a predetermined pattern. The exterior of the table 24 is made of a ceramic material, such as sintered AlN. As mentioned previously, a semiconductor wafer M, an object to be processed, can be placed on the upper surface of the table 24. The electrical resistance heater 30 is connected to a feeder line 32 laid inside the support 25, whereby controlled electric power is supplied to the electrical resistance heater 30. On the upper surface side of the table 24 is set a temperature-sensing unit such as a thermocouple 33. A lead wire 35 extending from this thermocouple 33 penetrates the support 25 and is drawn to the outside. A temperature of the wafer M is controlled according to a value (temperature) sensed by the thermocouple 33. Instead of the electrical resistance heater 30, a heating lamp may be used as a heating unit.

The table 24 has two or more, e.g., three, pin-insertion holes 34 vertically penetrating it (shown in FIGS. 1 and 2 are only two of the pin-insertion holes). In each pin-insertion hole 34, a lifting pin 36 is inserted in such a loose fit state that it can move up and down. To the lower end of the lifting pin 36 is fixed a lifting ring 38 made of ceramic, such as alumina, in the shape of an arc like an annular ring partially cut away. Namely, the lower end of each lifting pin 36 is supported by the upper surface of the lifting ring 38. An arm 38A extending from the lifting ring 38 is connected to a rod 40 penetrating the bottom 18 of the vessel. This rod 40 can be elevated by means of an actuator 42. This mechanism allows the lifting pins 36 to be raised above and lowered into the respective pin-insertion holes 34, thereby delivering a wafer M. Further, a stretchable bellows 44 is placed between the rod-penetrating hole in the bottom of the processing vessel 4 and the actuator 42. The bolt 40 can therefore go up and down while retaining the airtightness of the processing vessel 4.

To the shower head 6 are connected gas-supplying systems for supplying necessary process gases. Specifically, a high-melting-point-organometallic-material-gas-supplying system 46 for supplying a high-melting-point organometallic material gas, as well as a nitrogen-containing-gas-supplying system 48 for supplying a nitrogen-containing gas, which is one reactant-gas-supplying system, and a silicon-containing-gas-supplying system 50 for supplying a silicon-containing gas, which is another reactant-gas-supplying system, are connected to the shower head 6. A purge-gas-supplying system 52 is also connected to the shower head 6.

Specifically, the gas-supplying systems 46, 48, 50, 52 have gas lines 54, 56, 58, 60, respectively, and there are on-off valves 54A, 56A, 58A, 60A in the gas lines 54, 56, 58, 60, respectively, in their end sections. The start and stoppage of supply of each gas can thus be freely controlled. Further, flow controllers such as mass flow controllers (not shown in the figure) are in the gas lines 54, 56, 58, 60 on the upstream side. The supply flow rates of the respective gasses are controllable by these controllers. Furthermore, between the on-off valves 54A, 56A, 58A, 60A and the shower head 6, flow paths may be provided so that they by-pass the processing vessel 4 and directly connect the gas supply systems and an exhaust system. By exhausting the gases through the flow paths when not supplying the gases to the shower head 6, their flow rates can be kept stable. This manner works as a way of stopping the supply of the gases.

The high-melting-point organometallic material is bubbled through an inert gas such as Ar gas or vaporized by a vaporizer, and is then supplied as a high-melting-point organometallic material gas together with a carrier gas such as Ar gas. $N_2$ gas, He gas or the like may be also used as the carrier gas.

The Ta source carried by Ar gas is herein used as the high-melting-point organometallic material gas, as mentioned previously. $NH_3$ gas is used as the nitrogen-containing gas, monosilane ($SiH_4$) as the silicon-containing gas, and Ar gas as the purge gas. The above-described carrier gas serves also as a dilution gas.

In order to control the whole operation of this film deposition system 2, i.e., the start and stoppage of supply of each gas, and the regulation of wafer temperature, process pressure, etc., a controller 64 composed of a microcomputer and so forth is provided. This controller 64 has a storage medium 66 that stores a program for controlling the operation of the film deposition system as described above, and this storage medium 66 is composed of a flexible disc, a flush memory, a CD-ROM, a DVD, or a hard disk, for example.

Next, the operation of the film deposition system having the aforementioned structure will be described. As mentioned above, the following operations are controlled in accordance with the program stored in the storage medium 66.

Before carrying a semiconductor wafer M into the processing vessel 4 of the film deposition system 2, the processing vessel 4, connected to a load-lock chamber, for example, which is not shown in the figure, is evacuated. Further, the table 24 on which the wafer M is to be placed is heated to a predetermined temperature beforehand by the electrical resistance heater 30, a heating unit, and the temperature is stably maintained.

Under such conditions, an untreated semiconductor wafer M with a diameter of e.g., 300 mm, held by a carrier arm not shown in the figure, is carried in the processing vessel 4 through the gate 14 with the gate valve 16 opened. The raised lifting pins 36 receive this wafer M and are then lowered, whereby the wafer M is placed on the upper surface of the table 2.

Thereafter, various gases are supplied to the shower head 6, as will be described later. Simultaneously with this, the vacuum pump in the evacuation system 28 is continuously driven to evacuate both the processing vessel 4 and the exhaust-gas-concave space 20, and the openness of the pressure-regulating valve is adjusted to hold the atmosphere in the processing space S at a predetermined process pressure. Thus, a TaSiN film containing carbon (C) is deposited on the surface of the semiconductor wafer M. Herein, the carbon (C) and the nitrogen (N) are contained in the film by mainly being taken in from carbon components and nitrogen components contained in the Ta source gas. That is, a tantalum nitride film containing carbon may be formed even without using a carbon-containing gas and a nitrogen-containing gas as a supply gas other than the Ta source gas.

Gas supply modes will be specifically described hereinafter.

First Embodiment

The first embodiment of the method of film deposition according to the present invention will be described.

FIG. 2A is a diagram showing a gas supply mode in the first embodiment of the method of the invention. FIG. 9A shows the major film-deposition conditions and the analysis result of the formed thin film. As described above, herein, as a thin film of a metallic compound, a silicon tantalum nitride film containing carbon (TaSiN containing C) is formed.

As shown in FIG. 2A, a Ta source gas (herein, Taimato), an $NH_3$ gas and a monosilane gas ($SiH_4$) are simultaneously supplied into the processing vessel 4, and a film-deposition process is conducted by a CVD process for a predetermined time (film-deposition time) T1.

Thus, a TaSiN film containing C is formed. The process conditions are explained as follows. The process temperature is preferably within a range of 300 to 700° C., for example being set at 600° C. The process pressure is preferably within a range of 5 to 266 Pa, for example being set at 40 Pa (0.3 Torr). The film-deposition time T1 depends on the film thickness to be required, for example being set at 300 sec. Regarding flow rates of the respective gases, the flow rate of the Ta source gas is preferably within a range of 0.1 to 40 sccm, for example being set at 22 sccm. The flow rate of the Ar gas as the carrier gas is preferably within a range of 10 to 200 sccm, for example being set at 100 sccm. The flow rate of the Ar gas for the dilution is preferably within a range of 10 to 800 sccm, for example being set at 280 sccm. The flow rate of the $SiH_4$ gas is preferably within a range of 0 to 1000 sccm, more preferably within a range of 200 to 800 sccm, for example being set at 400 sccm. The flow rate of the $NH_3$ gas is preferably within a range of 0 to 1000 sccm, more preferably within a range of 0 to 500 sccm, for example being set at 20 sccm.

Herein, the important point is to set a partial pressure of the $NH_3$ gas as the nitrogen-containing gas in the processing vessel 4 to 17% or lower relative to the total pressure, in order to enhance the carbon density in the deposited thin film. By limiting the partial pressure of the $NH_3$ gas to 17% or lower, as described below, the carbon density in the film can be improved to 6% or more, which is a target value, preferably 8% or more (see the first embodiment in FIG. 9A). Herein, as described above, the total pressure is 0.3 Torr, and 10% thereof is 0.3 Torr.

Second Embodiment

The second embodiment of the method of film deposition according to the present invention will be described.

FIG. 2B is a diagram showing a gas supply mode in the second embodiment of the method of the invention. FIG. 9A shows the major film-deposition conditions and the analysis result of the formed thin film.

As shown in FIG. 2B, in the second embodiment, an annealing process is conducted to the thin film, which has been formed according to the first embodiment, under an in-situ situation without exposing the wafer M to the atmospheric air. For example, after the film-deposition process, the annealing process (annealing step) is conducted in the same processing vessel 4 without taking out the wafer M from the processing vessel 4. More concretely, after the completion of the film-deposition step, the supply of the Ta source gas and of the $SiH_4$ gas is stopped, but the supply of the $NH_3$ gas is continued, so that the annealing process is conducted for a predetermined time T2 in an atmosphere of the $NH_3$ gas.

The process conditions of the annealing step are explained as follows. The process temperature is preferably within a range of 300 to 800° C., for example being set at 600° C. The process pressure is preferably within a range of 0.1 to 10 Torr, for example being set at 2 Torr. When the temperature of the annealing step is set the same as the temperature of the film-deposition step, the time required for increasing or decreasing the wafer temperature may become unnecessary. Thus, in that case, the throughput can be improved. When used is an apparatus in which the wafer M is conveyed without being exposed to the atmospheric air, such as a cluster-tool type of apparatus, the annealing process may be conducted in a separate chamber apparatus (annealing apparatus), after the film-deposition process.

The flow rate of the $NH_3$ gas is preferably within a range of 100 to 2000 sccm, for example being set at 400 sccm. The time (time period) T2 of the annealing process is preferably within a range of 30 to 1800 sec, for example being set at 120 sec. If the annealing time T2 is shorter than 30 sec, the annealing effect is small. On the other hand, if the annealing time T2 is longer than 1800 sec, the annealing effect is saturated, that is, such surplus annealing process only leads to deterioration of the throughput.

When the wafer is taken out without conducting the annealing process, unreacted but active components on the surface of the wafer may react with oxygen in the atmospheric air, so that oxygen components in the film may be increased, which may have an adverse effect on the film characteristics. Like the present embodiment, if the annealing process is conducted in the atmosphere of the nitrogen-containing gas after the film-deposition step, unreacted components in the surface of the wafer react with nitrogen and are terminated with the nitrogen (modified). Thus, reaction with the oxygen in the atmospheric air is inhibited, so that the carbon density in the film can be maintained and the increase of the oxygen components can be inhibited (see the second embodiment in FIG. 9A).

Herein, in the second embodiment, the annealing process is conducted in the atmosphere of the $NH_3$ gas. However, instead of the atmosphere of the $NH_3$ gas, it may be conducted in the atmosphere of the $SiH_4$ gas, or in the atmosphere of a mixed gas of the $NH_3$ gas and the $SiH_4$ gas. In particular, when the $SiH_4$ gas is supplied to conduct the annealing process, it is preferable to sufficiently conduct the annealing process until a thin silicon film is formed on the wafer. In the case, the deposited TaSiN film containing carbon is covered (capped) with Si, so that oxidation may be effectively inhibited.

<Variation (2-1) of the Second Embodiment>

A variation of the second embodiment of the method of film deposition according to the present invention will be described.

FIG. 3 is a diagram showing a gas supply mode in the variation of the second embodiment of the method of the present invention.

In the second embodiment of FIG. 2B, the film-deposition step and the annealing step are conducted once. As shown in FIG. 3, in the present variation, the film-deposition step and the annealing step are repeated in this order more than once. One cycle consists of one film-deposition step and one annealing step. Then, the number of cycles is determined depending on the film thickness to be required.

In the present variation, since the film-deposition step and the annealing step are repeated, the film-deposition time T1 and the annealing time T2 in one cycle can be set shorter than those in the second embodiment shown in FIG. 2B. For example, in FIG. 3, the film-deposition time T1 is about 30 sec, and the annealing time T2 is about 10 sec. Even these process conditions can achieve the same effect as the second embodiment.

Third Embodiment

The third embodiment of the method of film deposition according to the present invention will be described.

FIG. 4A is a diagram showing a gas supply mode in the third embodiment of the method of the invention. FIG. 9A shows the major film-deposition conditions and the analysis result of the formed thin film.

In the first embodiment and the second embodiment, during the film-deposition process, the $NH_3$ gas and the $SiH_4$ gas are supplied. However, in the third embodiment, the supply of the both gases is stopped, and only the Ta source gas is supplied. That is, as shown in FIG. 4A, the Ta source gas is supplied together with the Ar carrier gas, and a thin film is deposited for a predetermined time T3 by means of a CVD process. The thin film doesn't contain Si, but organic components of the Ta source gas are dissociated, so that a TaN film containing C is formed as the thin film (see the third embodiment in FIG. 9A).

The process conditions are explained as follows. The process temperature is preferably within a range of 300 to 700° C., for example being set at 400° C. (which is lower than those in the first and second embodiments). The process pressure is preferably within a range of 10 to 266 Pa, for example being set at 40 Pa (which is the same as that in the first embodiment). The film-deposition time T3 depends on the film thickness to be required, for example being set at 300 sec.

Regarding flow rates of the respective gases, the flow rate of the Ta source gas is preferably within a range of 0.1 to 40 sccm, for example being set at 22 sccm (which is the same as that in the first embodiment). The flow rate of the Ar gas as the carrier gas is preferably within a range of 10 to 200 sccm, for example being set at 100 sccm (which is the same as that in the first embodiment). The flow rate of the Ar gas for the dilution is preferably within a range of 10 to 800 sccm, for example being set at 520 sccm. The flow rates of the $SiH_4$ gas and the $NH_3$ gas are "zero", as described above (these gases are not supplied).

Herein, the important point is to set a partial pressure of the $NH_3$ gas as the nitrogen-containing gas in the processing vessel 4 to 17% or lower relative to the total pressure, in order to enhance the carbon density in the deposited thin film. In the third embodiment, the flow rate of the $NH_3$ gas is "zero" (the $NH_3$ gas is not supplied), so that the partial pressure of the $NH_3$ gas is also "zero". In the case as well, the carbon density in the film can be improved to 6% or more, which is a target value, preferably 8% or more (see the third embodiment in FIG. 9A).

Herein, the supply of the Ta source gas and gas-exhaustion (gas-discharging) may be alternately conducted, in order to deposit a TaN film.

<Variation (3-1) of the Third Embodiment>

A variation of the third embodiment of the method of film deposition according to the present invention will be described.

FIG. 4B is a diagram showing a gas supply mode in the variation of the third embodiment of the method of the present invention.

As shown in FIG. 4B, in the present variation, an annealing process is conducted to the thin film, which has been formed according to the third embodiment, under an in-situ situation without exposing the wafer M to the atmospheric air. For example, after the film-deposition process, the annealing process (annealing step) is conducted in the same processing vessel 4 without taking out the wafer M from the processing vessel 4. More concretely, after the completion of the film-deposition step, the supply of the Ta source gas is stopped, and the supply of the $NH_3$ gas is started, so that the annealing process is conducted for a predetermined time T4 in an atmosphere of the $NH_3$ gas.

The process conditions of the annealing step are explained as follows. The process temperature is preferably within a range of 300 to 800° C., for example being set at 600° C. The process pressure is preferably within a range of 0.1 to 10 Torr, for example being set at 2 Torr. When the temperature of the annealing step is set the same as the temperature of the film-deposition step, the time required for increasing or decreasing the wafer temperature may become unnecessary. Thus, in that case, the throughput can be improved. When used is an apparatus in which the wafer M is conveyed without being exposed to the atmospheric air, such as a cluster-tool type of apparatus, the annealing process may be conducted in a separate chamber apparatus (annealing apparatus), after the film-deposition process.

The flow rate of the $NH_3$ gas is preferably within a range of 100 to 2000 sccm, for example being set at 400 sccm. The time (time period) T2 of the annealing process is preferably within a range of 30 to 1800 sec, for example being set at 120 sec. If the annealing time T4 is shorter than 30 sec, the annealing effect is small. On the other hand, if the annealing time T4 is longer than 1800 sec, the annealing effect is saturated, that is, such surplus annealing process only leads to deterioration of the throughput.

When the wafer is taken out without conducting the annealing process, unreacted but active components on the surface of the wafer may react with oxygen in the atmospheric air, so that oxygen components in the film may be increased, which may have an adverse effect on the film characteristics (see the third embodiment in FIG. 9A). Like the present variation, if the annealing process is conducted in the atmosphere of the nitrogen-containing gas after the film-deposition step, unreacted components in the surface of the wafer react with nitrogen and are terminated with the nitrogen (modified). Thus, reaction with the oxygen in the atmospheric air is inhibited, so that the carbon density in the film can be maintained and the increase of the oxygen components can be inhibited.

Herein, in the present variation, the annealing process is conducted in the atmosphere of the $NH_3$ gas. However, instead of the atmosphere of the $NH_3$ gas, it may be conducted in the atmosphere of the $SiH_4$ gas, or in the atmosphere of a mixed gas of the $NH_3$ gas and the $SiH_4$ gas. In particular, when the $SiH_4$ gas is supplied to conduct the annealing process, it is preferable to sufficiently conduct the annealing process until a thin silicon film is formed on the wafer. In the case, the deposited TaN film containing C is covered (capped) with Si, so that oxidation may be effectively inhibited.

In addition, in the same manner as the variation (2-1) explained with reference to FIG. 3, the film-deposition step and the annealing step in FIG. 4B may be repeated in this order more than once while the film-deposition time T3 and the annealing time T4 are respectively set shorter.

Comparisons 1-3

Herein, comparisons 1-3 were evaluated against the above embodiments. The evaluation results are explained.

Figure 5A:
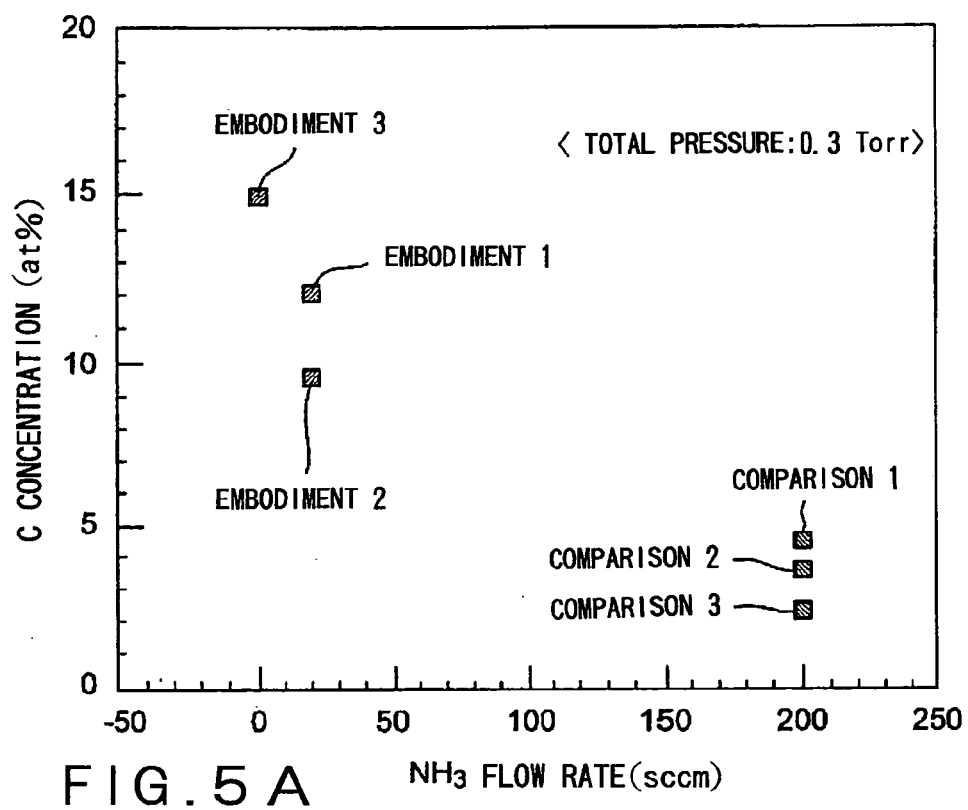
FIG. 5A is a graph showing the relationship between the flow rate of $NH_3$ gas and the carbon density.
Figure 5B:
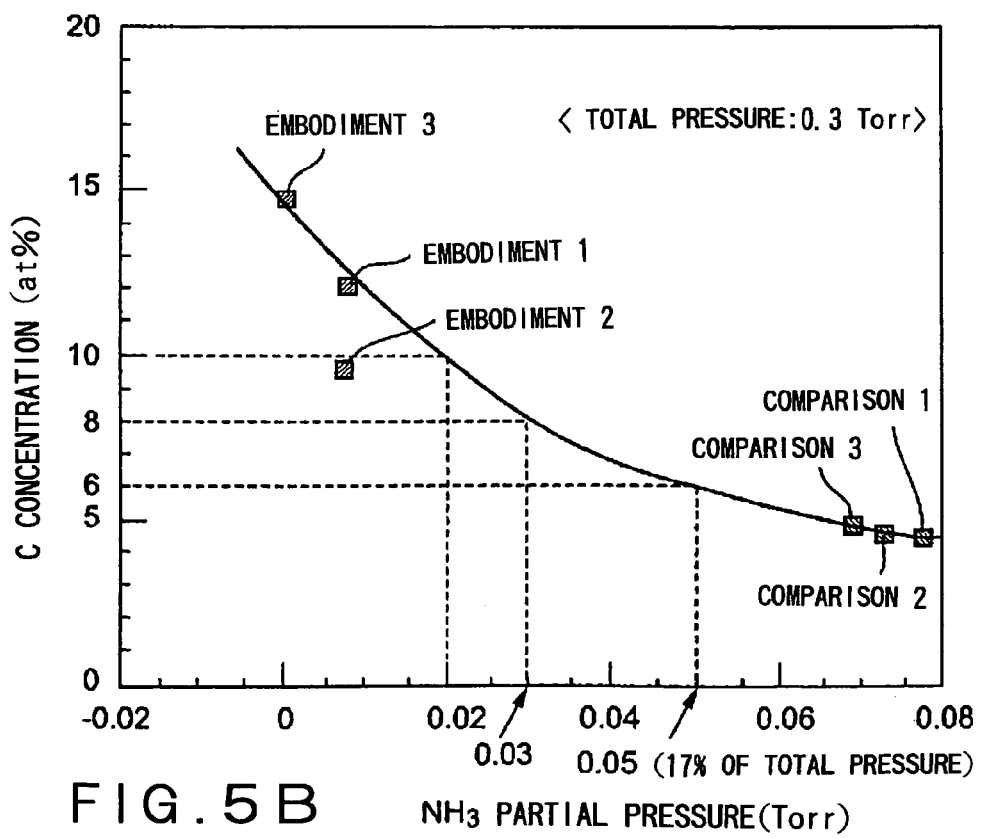
FIG. 5B is a graph showing the relationship between the partial pressure of $NH_3$ gas and the carbon density.
Figure 6:
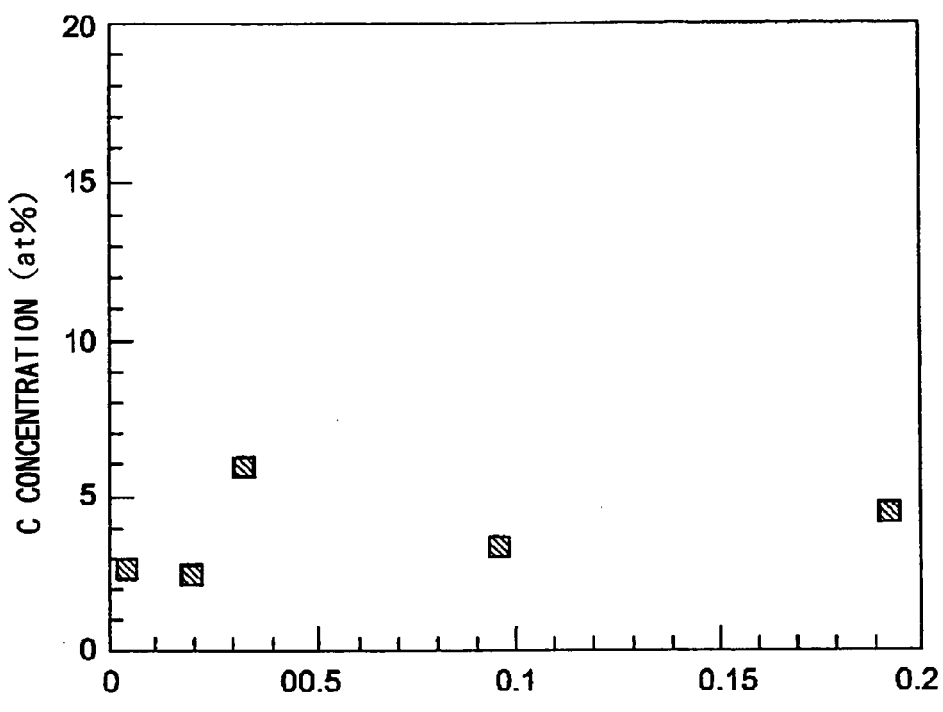
FIG. 6 is a graph showing the dependency of the carbon density in the film on the partial pressure of $SiH_4$ gas.

FIG. 5A is a graph showing the relationship between the flow rate of the $NH_3$ gas and the carbon density. FIG. 5B is a graph showing the relationship between the partial pressure of the $NH_3$ gas and the carbon density. FIG. 9A shows the conditions for TaSiN film deposition and the analysis result of each atom in the films by means of an XPS (Xray Photoelectron Spectroscopy) analyzing apparatus.

The process conditions of the embodiments 1-3 are as explained above. The process conditions of the comparisons 1-3 are as described in FIG. 9A. That is, the flow rate of the Ta source gas in the comparisons 1-3 is the same as that in the embodiments 1-3. The process pressure is set to 0.3 Torr in all the cases. In the comparisons 1-3, the flow rate of the $NH_3$ gas is 200 sccm, which is the same as the conventional film-depositing method. That is, the partial pressure of the $NH_3$ gas is set relatively higher. In addition, the process temperature of the comparison 1 is 600° C., and the process temperature of the comparisons 2 and 3 is 400° C. In FIG. 9A, "DR" shows the film-deposition rate.

The temperature dependency of the carbon density in the film was studied while the process conditions other than the film-deposition temperature were set the same. As a result, within a range of 400 to 600° C., which is general as a film-deposition temperature, there was scarcely any change in the carbon density in the film. That is, the temperature dependency of the carbon density in the film was scarcely found.

As shown in FIG. 9A, when the flow rate of the $NH_3$ gas is set to 200 sccm so that the partial pressure of the $NH_3$ gas is relatively higher (comparisons 1-3), the carbon density in the film was 4.6, 2.8 and 3.5 atomic % for the respective cases, which were not high.

On the other hand, as shown in the embodiments 1-3, when the flow rate of the $NH_3$ gas is set smaller or to "zero" so that the partial pressure of the $NH_3$ gas is decreased, the carbon density in the film was 12.2, 9.5 and 14.8 atomic % for the respective cases, which were considerably higher than those in the comparisons 1-3 that are the conventional film-deposition method.

FIGS. 5A and 5B show the relationship between the flow rate of the $NH_3$ gas and the carbon density, and the relationship between the partial pressure of the $NH_3$ gas and the carbon density, based on the analysis result shown in FIG. 9A. As shown in FIGS. 5A and 5B, when the flow rate of the $NH_3$ gas or the partial pressure of the $NH_3$ gas is decreased, the carbon density in the film can be decreased. In particular, as shown in FIG. 5B, there is strong correlation between the partial pressure of the $NH_3$ gas and the carbon density. From the graph, in order to achieve a carbon density of 6% or more, which is a target value, it can be understood that sufficient is to set the partial pressure of the $NH_3$ gas to 0.05 Torr or lower, i.e., 17% or lower relative to the total pressure of 0.3 Torr. In addition, it can be understood that sufficient is to set the partial pressure of the $NH_3$ gas to 0.03 Torr or lower, in order to achieve a carbon density of 8% or more, which is preferable. Furthermore, it can be understood that sufficient is to set the partial pressure of the $NH_3$ gas to 0.02 Torr or lower, in order to achieve a carbon density of 10% or more, which is more preferable.

The reason why the carbon density in the film is reduced by reducing the partial pressure of the $NH_3$ gas is that the dissociation of the Ta source gas is inhibited by the reduction of the supply amount of the $NH_3$ gas, the Ta source gas partly remains in an undissociated state, and the carbon components in the undissociated Ta source gas are taken into the film.

In the case, however, the undissociated source gas is relatively active. Thus, when the wafer is exposed to the atmospheric air after the film-deposition process, the undissociated but active source gas may react with oxygen in the atmospheric air to take the oxygen into the film, so that the oxygen density may be raised, which may have an adverse effect on the film quality. For example, the oxygen density is 12.0% in the first embodiment, and the oxygen density is 30.5% in the third embodiment. They are higher than those in the comparisons 1-3.

Then, as explained in the second embodiment and the variation (3-1), not shown in FIG. 9A, it is preferable that, after the film-deposition step, the annealing process is conducted to the wafer under an in-situ situation or the like in the atmosphere of the $NH_3$ gas and/or the $SiH_4$ gas, without exposing the wafer to the atmospheric air, in order to terminate distal ends of (molecules of) the undissociated source gas with nitrogen atoms and/or silicon atoms. Thus, a few carbon atoms are consumed, so that the carbon density is reduced from 12.2% of the first embodiment to 9.5%, which is however still high. On the other hand, the oxygen density is remarkably reduced from 12.0% of the first embodiment to 7.7% (the oxygen density in the film is preferably "zero" or closer to "zero").

In addition, for a confirmation, the dependency of the carbon density in the film on the partial pressure of the $SiH_4$ gas was studied while only the flow rate of the $SiH_4$ gas was variously changed among the process conditions of the first embodiment. As a result, there was scarcely any change in the carbon density in the film, depending on the partial pressure of the $SiH_4$ gas. That is, the dependency of the carbon density in the film on the partial pressure of the $SiH_4$ gas was scarcely found.

Furthermore, the relationship between the partial pressure of $NH_3$ gas and the carbon density in the film and the flat band voltage (work function) in the first embodiment was evaluated. The evaluation results are explained.

Figure 7:
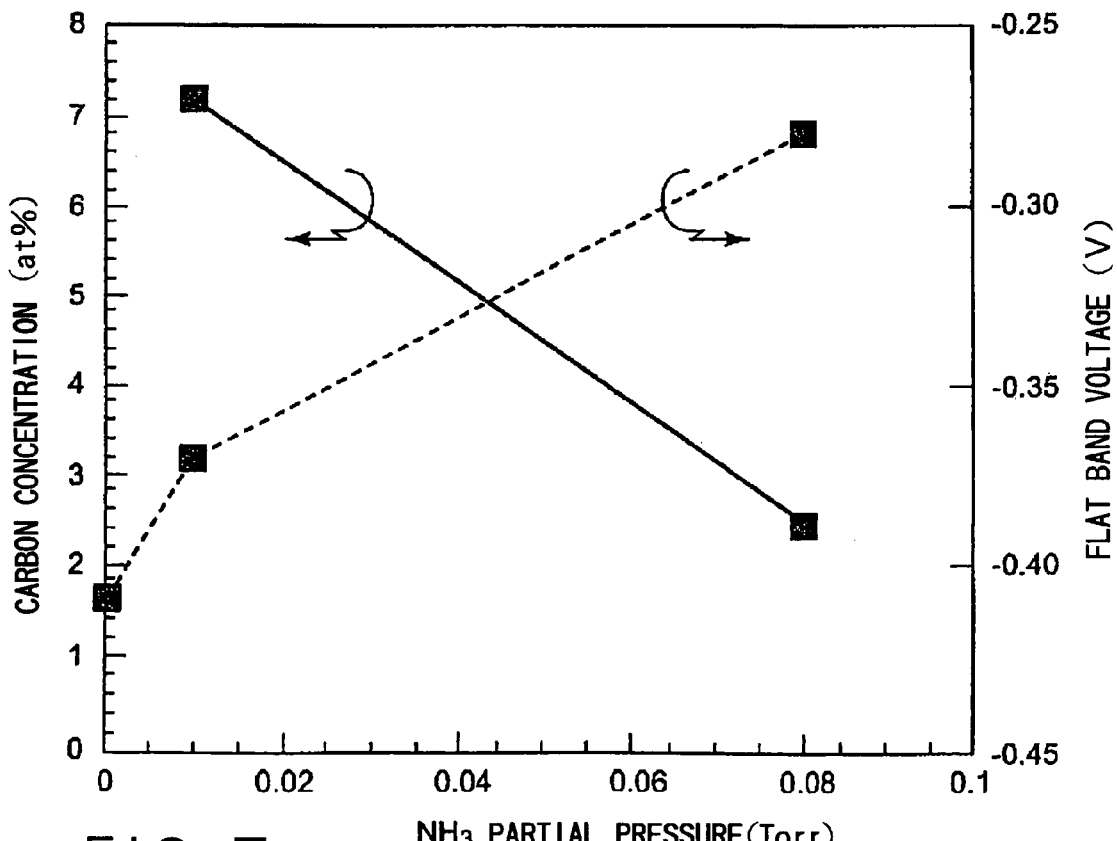
FIG. 7 is a graph showing the relationship between the partial pressure of $NH_3$ gas and the carbon density in the film and the flat band voltage (work function), in the first embodiment.

FIG. 7 is a graph showing the relationship between the partial pressure of $NH_3$ gas and the carbon density in the film and the flat band voltage (work function), in the first embodiment. As shown in FIG. 7, when the partial pressure of $NH_3$ gas is smaller, the carbon density in the film is larger. To the contrary, when the partial pressure of $NH_3$ gas is smaller, the flat band voltage is also smaller. The small flat band voltage leads to a small work function. That is, when the partial pressure of $NH_3$ gas is made smaller, the carbon density in the film is made larger and the work function can be made smaller, so that the threshold value can be reduced. Preferably, when the partial pressure of $NH_3$ gas is made to 0.028 or lower, it is possible to achieve a carbon density of 6% or more and a flat band voltage of −0.35 or lower.

Fourth Embodiment

The fourth embodiment of the method of film deposition according to the present invention will be described.

In the first to third embodiments, the Ta source gas and the $NH_3$ gas are mainly simultaneously supplied, and the film-deposition process is conducted for a relatively long time, for example about 300 sec, by means of a CVD method. However, the present invention is not limited thereto. The Ta source gas and the $NH_3$ gas may be alternately and repeatedly supplied, while the supply time of each gas may be shortened, in order to deposit a TaSiN film containing C or a TaN film containing C.

Figure 8A:
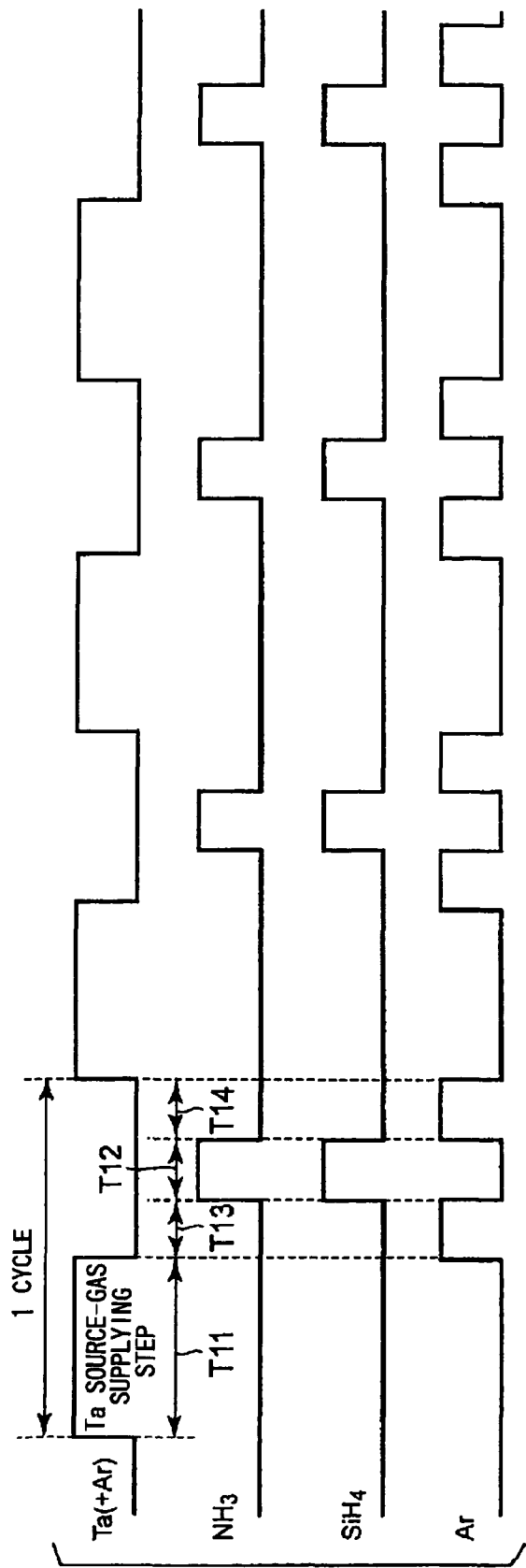
FIG. 8A is a diagram showing a gas supply mode in a fourth embodiment of the method of the present invention.

FIG. 8A is a diagram showing a gas supply mode in the fourth embodiment of the method of the invention. FIG. 9B shows the major film-deposition conditions and the analysis result of the formed thin film.

As shown in FIG. 8A, in the present embodiment, a step of supplying the Ta source gas (time period T11) and a step of supplying the $NH_3$ gas (time period T12) are alternately carried out more than once (two or more times). In the case, a purging step of purging the gas remaining in the processing vessel 4 (time period T13 and time period T14) is carried out between the Ta source-supplying step and the $NH_3$ gas-supplying step. In this purging step, Ar gas is fed as a purge gas, to accelerate exhaust of the gas remaining in the vessel. In this step, it is preferable to purge the vessel to such an extent that the Ta source gas remains in the processing vessel 4. Other inert gas, such as $N_2$, He, or Ne, may also be used as a purge gas. Further, in the purging step, only evacuation may be continued with the supply of all the gases stopped. (When the $SiH_4$ gas is not supplied, a TaN film containing C is formed (fifth embodiment).)

In the course of the $NH_3$ gas-supplying step, a $SiH_4$ gas-supplying step is carried out. By doing so, silicon (Si) is incorporated into tantalum nitride film to be deposited, and a TaSiN film is formed. The $SiH_4$ gas is herein supplied simultaneously with and in synchronization with the supply of the $NH_3$ gas. The time interval between the starting point of the Ta source-supplying step and that of the next Ta source-supplying step is defined as one cycle.

The following are the process conditions.

The time period T11 of the Ta source-supplying step is preferably set within the range of 1 to 60 seconds, e.g., to 30 seconds. Both the time period T12 of the $NH_3$ gas-supplying step and the time period of the monosilane-supplying step are preferably set within the range of 1 to 60 seconds, e.g., to 10 seconds. The time periods T3 and T4 of the purging steps before and after the $NH_3$ gas-supplying step, respectively, are preferably set within the range of 1 to 60 seconds, e.g., to 10 seconds.

The Ta source flow rate in the Ta source-supplying step (time period T11) is preferably in the range of 0.1 to 40 sccm; it is controlled by regulating the source bottle temperature and the flow rate of the Ar gas as a carrier gas. The source bottle temperature and the Ar carrier gas flow rate are herein set to 46.5° C. and 100 sccm, respectively. Ar gas for dilution is further fed at a flow rate of 250 sccm.

The $NH_3$ flow rate in the $NH_3$ gas-supplying step (time period T12) is preferably in the range of 10 to 1000 sccm and is herein set to 200 sccm. The $SiH_4$ flow rate in the monosilane-supplying step is preferably from 10 to 1000 sccm and is herein set to 200 sccm.

The Ar flow rate in the two purging steps (time periods T13 and T14) is preferably in the range of 5 to 2000 sccm and is herein set to 20 sccm.

The process pressure is preferably from 1.3 to 667 Pa and is herein held constant at 40 Pa.

FIG. 9B shows the process conditions for the present embodiment and the analysis result of the thin film containing C by means of the XPS. Herein, forty cycles of repetition was conducted to deposit the thin film.

As shown in FIG. 9B, the carbon density in the thin film of the fourth embodiment was 9.2%, and the oxygen density therein was 6.1%. That is, according to the fourth embodiment, the carbon density is higher than the target value 8%, and also the oxygen density is inhibited low. It is more preferable when the oxygen density in the film is closer to "zero"

B (boron) or As (arsenic) may be introduced into the thin film of the fourth embodiment by supplying another impurity, for example a hydride such as $BH_3$, $B_2H_6$ or $AsH_3$.

Fifth Embodiment

The fifth embodiment of the method of film deposition according to the present invention will be described.

Figure 8B:
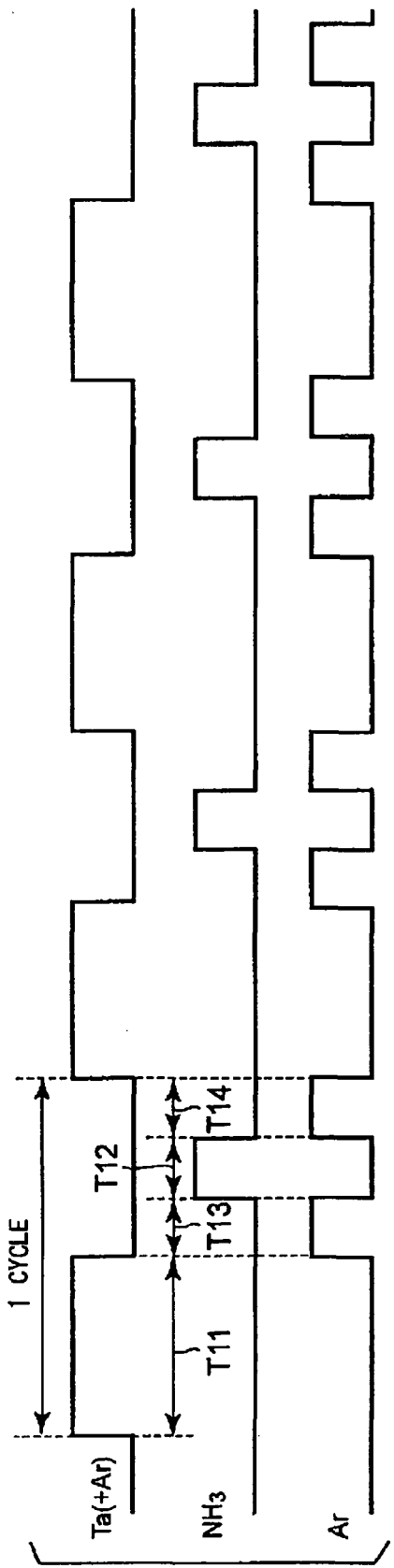
FIG. 8B is a diagram showing a gas supply mode in a fifth embodiment of the method of the present invention.

FIG. 8B is a diagram showing a gas supply mode in the fifth embodiment of the method of the invention. FIG. 9B shows the major film-deposition conditions and the analysis result of the formed thin film.

As shown in FIG. 8B, in the present embodiment, the step of supplying the $SiH_4$ gas is completely removed from the fourth embodiment shown in FIG. 8A. The other process conditions are the same as the fourth embodiment.

In the fourth embodiment, the Ta source gas is supplied, and absorbed by the surface of the wafer, so that the film is deposited thereon. Thereafter, the purging step is conducted, and the active parts (of molecules) of the Ta source gas are terminated with the $NH_3$ gas and the $SiH_4$ gas. These steps, each of which is short, are repeatedly conducted to deposit the thin film. Compared therewith, in the fifth embodiment, the active parts (of molecules) of the Ta source gas are terminated only with the $NH_3$ gas, without the $SiH_4$ gas.

FIG. 9B shows the process conditions for the present embodiment and the analysis result of the thin film containing C by means of the XPS. Herein, forty cycles of repetition was conducted to deposit the thin film.

As shown in FIG. 9B, the carbon density in the thin film of the fifth embodiment was 11.7%, and the oxygen density therein was 9.1%. That is, according to the fifth embodiment, the carbon density is higher than the target value 8%, and also the oxygen density is inhibited low. It is more preferable when the oxygen density in the film is closer to "zero".

In the fifth embodiment, the terminating process may be conducted by supplying the $SiH_4$ gas as well, instead of supplying the $NH_3$ gas. B (boron) or As (arsenic) may be introduced into the thin film of the fifth embodiment by supplying another impurity, for example a hydride such as $BH_3$, $B_2H_6$ or $AsH_3$.

Figure 10:
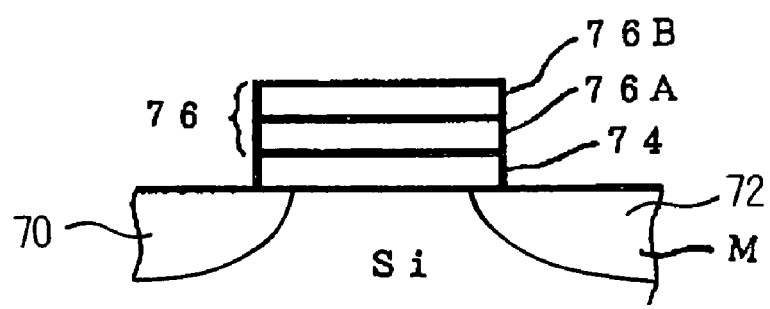
FIG. 10 is a schematic sectional view showing an example of transistor, using a thin film of a metallic compound formed by the method of the present invention.

The thin metallic-compound film containing carbon, which has been formed according to each of the above embodiments, may be used for a gate electrode of a transistor as shown in FIG. 10, for example.

FIG. 10 is a schematic sectional view showing an example of transistor, using a thin film of a metallic compound formed by the method of the present invention.

As shown in FIG. 10, the semiconductor wafer M as an object to be processed consists of a silicon wafer, for example. A gate electrode 76 is provided between a source region 70 and a drain region 72 on the semiconductor wafer M, via a gate insulation film 74. The gate electrode 76 mainly consists of: a thin film 76A made of a metallic compound of a high-melting-point metal, containing carbon (carbon density is 6% or more), formed by the method of the present invention on the gate insulation film 74; and a polysilicon film 76B layered on the thin film 76A.

As the gate insulation film 74, in addition to an $SiO_2$ film, a high dielectric material such as hafnia ($HfO_2$), zirconia ($ZrO_2$), silicate thereof (HfSiO, ZrSiO), or silicate nitride thereof (HfSiON, ZrSiON) may be used. In addition, if necessary, a silicon nitride film or the like may be formed as a protection film on an upper surface and a lateral surface of the polysilicon film 76B.

In the above transistor, the gate electrode can have a sufficient low threshold value, as described above.

Although the above embodiments have been described by referring to the case where monosilane is used as the silicon-containing gas, the present invention is not limited to this. A gas selected from the group consisting of monosilane [$SiH_4$], disilane [$Si_2H_6$], methylsilane [$CH_3SiH_3$], dimethylsilane [$(CH_3)_2SiH_2$], hexamethyidisilazane (HMDS), disilylamine (DSA), trisilylamine (TSA), bistertiarybutylaminosilane (BTBAS), trimethylsilane, tetramethylsilane, bisdimethylaminosilane, tetradimethylaminosilane, triethylsilane, and tetraethylsilane can be used as the silicon-containing gas.

Further, although the above embodiments have been described by referring to the case where ammonia is used as the nitrogen-containing gas, the present invention is not limited to this. A compound selected from the group consisting of ammonia [$NH_3$], hydrazine [$NH_2NH_2$], methylhydrazine [$(CH_3)(H)NNH_2$], dimethylhydrazine [$(CH_3)_2NNH_2$], t-butylhydrazine [$(CH_3)_3C(H)NNH_2$], phenylhydrazine [$C_6H_5N_2H_3$], 2,2'-azo-isobutane [$(CH_3)_6C_2N_2$], ethylazide [$C_2H_5N_3$], pyridine [$C_5H_5N$], and pyrimidine [$C_4H_4N_2$] can be used as the nitrogen-containing gas.

Although the above-described embodiments have been described by referring to the case where $Ta(Nt-Am)(NMe_2)_3$ is used as a high-melting-point organometallic material containing tantalum, the present invention is not limited to this. A compound selected from the group consisting of t-butyliminotris(diethylamino)tantalum (TBTDET): [$(NEt_2)_3TaN-Bu^t$], pentakis(ethylmethylamino)tantalum (PEMAT): [$Ta(NMeEt)_5$], pentakis(dimethylamino)tantalum (PDMAT): [$Ta(NMe_2)_5$], pentakis(diethylamino)tantalum (PDEAT): [$Ta(NEt_2)_5$], t-butyliminotris(ethylmethylamino)tantalum (TBTMET): [$(NEtMe)_3TaN-Bu^t$], t-butylimidotris(dimethylamino)tantalum (TBTDMT): [$(NMe_2)_3TaN-Bu^t$], and t-amylimidotris(dimethylamino)tantalum (Taimata): [$(NMe_2)_3TaNC(CH_3)_2C_2H_5$] or [$Ta(Nt-Am)(NMe_2)_3$] can be used as a high-melting-point organometallic material containing tantalum.

A compound selected from the group consisting of tetrakisdiethylaminotitanium Ti [N $(C_2H_5)_2$]$_4$, tetrakisdimethylaminotitanium Ti[$N(CH_3)_2$]$_4$, and tetrakisethylmethylaminotitanium Ti[$N(CH_3)(C_2H_5)$]$_4$ can be used as a high-melting-point organometallic material containing titanium.

A compound selected from the group consisting of hexacarbonyltungsten $W(CO)_6$, and bistertiarybutylimidobisdimethyl-amidotungsten $(t-Bu^tN)_2(Me_2N)_2W$ can be used as a high-melting-point organometallic material containing tungsten.

A compound selected from the group consisting of tetrakisdimethylaminohafnium Hf[$N(CH_3)_2$]$_4$, and dimethylbis(cyclopenta-dienyl)hafnium $Hf(CH_3)_2(C_5H_5)_2$ can be used as a high-melting-point organometallic material containing hafnium.

Furthermore, although the above embodiments have been described by referring to the case where the object to be processed is a semiconductor wafer, the present invention is not limited to this and is, of course, applicable to LCD substrates, glass substrates, ceramic substrates, etc.

The invention claimed is:

1. A method of film deposition that comprises:
    a film-depositing step of supplying a high-melting-point organometallic material gas and a nitrogen-containing gas to a processing vessel that can be evacuated, so as to deposit a thin film of a metallic compound of a high-melting-point metal on a surface of an object to be processed placed in the processing vessel,
    wherein a partial pressure of the nitrogen-containing gas during the film-depositing step is 17% or lower relative to a total pressure, in order to increase carbon density contained in the thin film to 6% or more.

2. The method of film deposition according to claim 1, further comprising: an annealing step of annealing the thin film in an atmosphere of a nitrogen-including gas or a silicon-containing gas, after the film-deposition step.

3. The method of film deposition according to claim 2, wherein the annealing step is conducted until a silicon film is formed on the thin film, in the atmosphere of the silicon-containing gas.

4. The method of film deposition according to claim 2, wherein the film-depositing step and the annealing step are repeated in this order more than once.

5. The method of film deposition according to claim 2, wherein the silicon-containing gas is selected from the group consisting of monosilane [$SiH_4$], disilane [$Si_2H_6$], methylsilane [$CH_3SiH_3$], dimethylsilane [$(CH_3)_2SiH_2$], hexamethyldisilazane (HMDS), disilylamine (DSA), trisilylamine (TSA), bistertiarybutylaminosilane (BTBAS), trimethylsilane, tetramethylsilane, bisdimethylaminosilane, tetradimethylaminosilane, triethylsilane, and tetraethylsilane.

6. The method of film deposition according to claim 2, wherein the nitrogen-containing gas is a compound selected from the group consisting of ammonia [$NH_3$], hydrazine [$NH_2NH_2$], methylhydrazine [$(CH_3)(H)NNH_2$], dimethylhydrazine [$(CH_3)_2NNH_2$], t-butylhydrazine [$(CH_3)_3C(H)NNH_2$], phenylhydrazine [$C_6H_5N_2H_3$], 2,2'-azoisobutane [$(CH_3)_6C_2N_2$], ethylazide [$C_2H_5N_3$], pyridine [$C_5H_5N$], and pyrimidine [$C_4H_4N_2$].

7. The method of film deposition according to claim 1, wherein the high-melting-point organometallic material contains a metal selected from Ta (tantalum), Ti (titanium), W (tungsten), Hf (hafnium), and Zr (zirconium).

* * * * *